(12) United States Patent
Liu

(10) Patent No.: US 7,866,991 B2
(45) Date of Patent: Jan. 11, 2011

(54) ELECTRONIC DEVICE

(75) Inventor: Chuan-Wu Liu, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 0 days.

(21) Appl. No.: 12/546,798

(22) Filed: Aug. 25, 2009

(65) Prior Publication Data

US 2010/0279527 A1 Nov. 4, 2010

(30) Foreign Application Priority Data

Apr. 30, 2009 (CN) .................... 2009 1 0302017

(51) Int. Cl.
*H01R 13/44* (2006.01)
(52) U.S. Cl. ........................ 439/136; 439/138
(58) Field of Classification Search .......... 439/135–138
See application file for complete search history.

(56) References Cited

U.S. PATENT DOCUMENTS

| 5,997,318 | A  | * | 12/1999 | Chou ......................... 439/136 |
| 6,771,939 | B1 | * | 8/2004  | Barnett et al. ............... 455/90.3 |
| 6,780,031 | B1 | * | 8/2004  | Valls .......................... 439/147 |
| 2003/0232543 | A1 | * | 12/2003 | Takada et al. ............... 439/694 |
| 2009/0263994 | A1 | * | 10/2009 | Hsieh et al. ................. 439/136 |

* cited by examiner

*Primary Examiner*—Hien Vu
(74) *Attorney, Agent, or Firm*—Steven M. Reiss

(57) ABSTRACT

An electronic device includes a housing having a sidewall, a socket assembled in the housing, and a protection cover slidably assembled on the sidewall of the housing. The sidewall of the housing defines a sliding slot and a socket hole. The socket is exposed by the socket hole. The protection cover includes a main body, a latching portion and a sliding block connecting the main body and the latching portion. The main body and the latching portion are respectively positioned on opposite sides of the sidewall. The sliding block is slidably engaged in the sliding slot, thus enabling the main body to slide between a first and a second positions to expose or cover the socket.

18 Claims, 6 Drawing Sheets

ELECTRONIC DEVICE

BACKGROUND

1. Technical Field

The present disclosure generally relates to electronic devices and, particularly to an electronic device having a protection cover to protect a socket of the electronic device.

2. Description of Related Art

An electronic device, such as a mobile phone, a notebook computer, and a personal digital assistant generally has a plurality of sockets including an earphone socket, an universal serial bus (USB) socket, and a charger socket. However, when those sockets are not being used, they are exposed to outside, thus dust in the air may easily enter and pollute the sockets. As a result, the electronic device may not be function normally, due to bad electrical connection between the sockets and the corresponding external devices.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views, and all the views are schematic.

DETAILED DESCRIPTION

The electronic device may be a mobile phone, a notebook computer, or a personal digital assistant. Hereinafter, for the purposes of conveniently describing the electronic device, an embodiment of a mobile phone having a protection cover to protect an earphone socket is described and illustrated.

Figure 1:
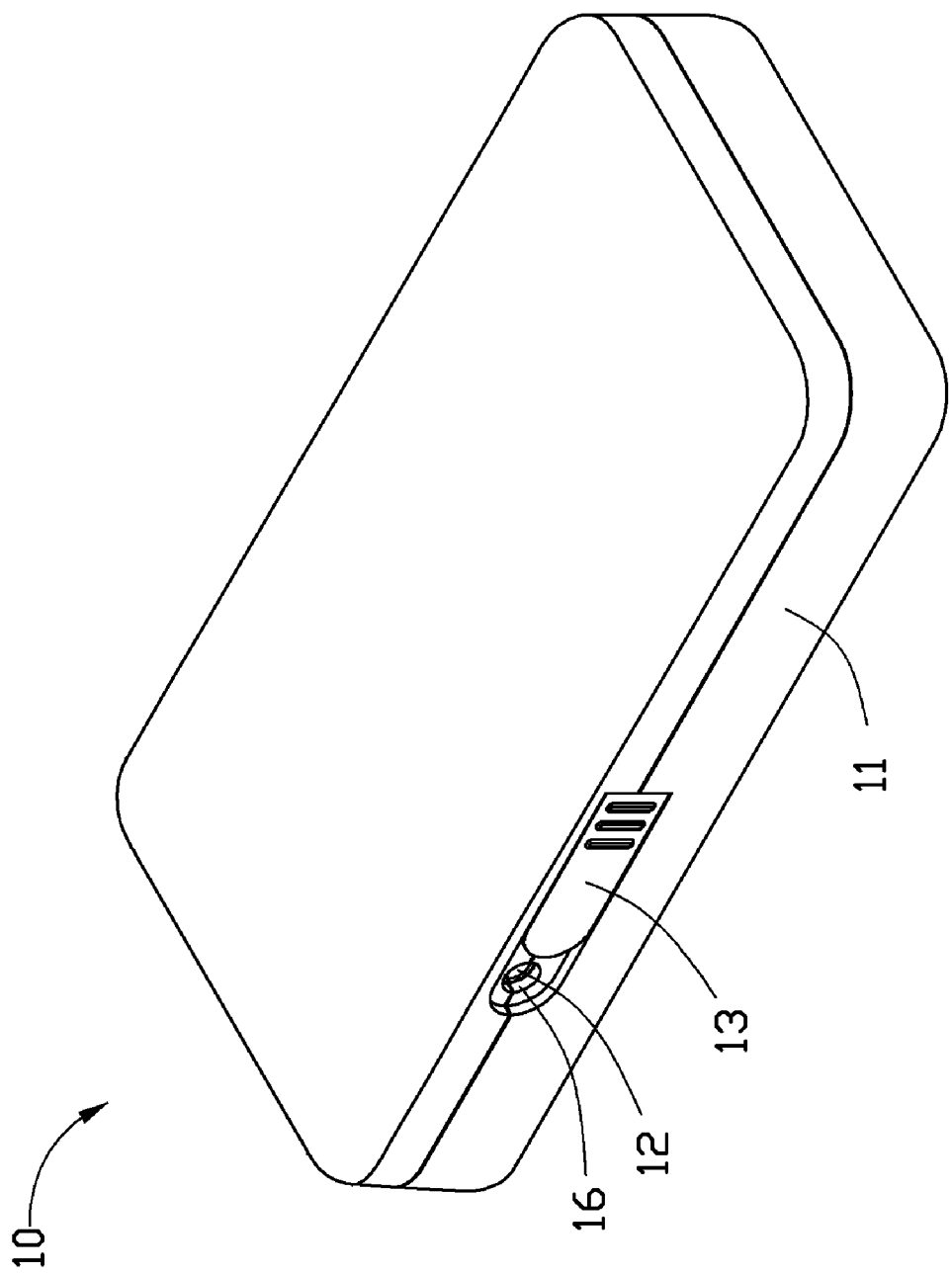
FIG. 1 is an assembled, isometric view of an exemplary embodiment of an electronic device in a first work state.
Figure 2:
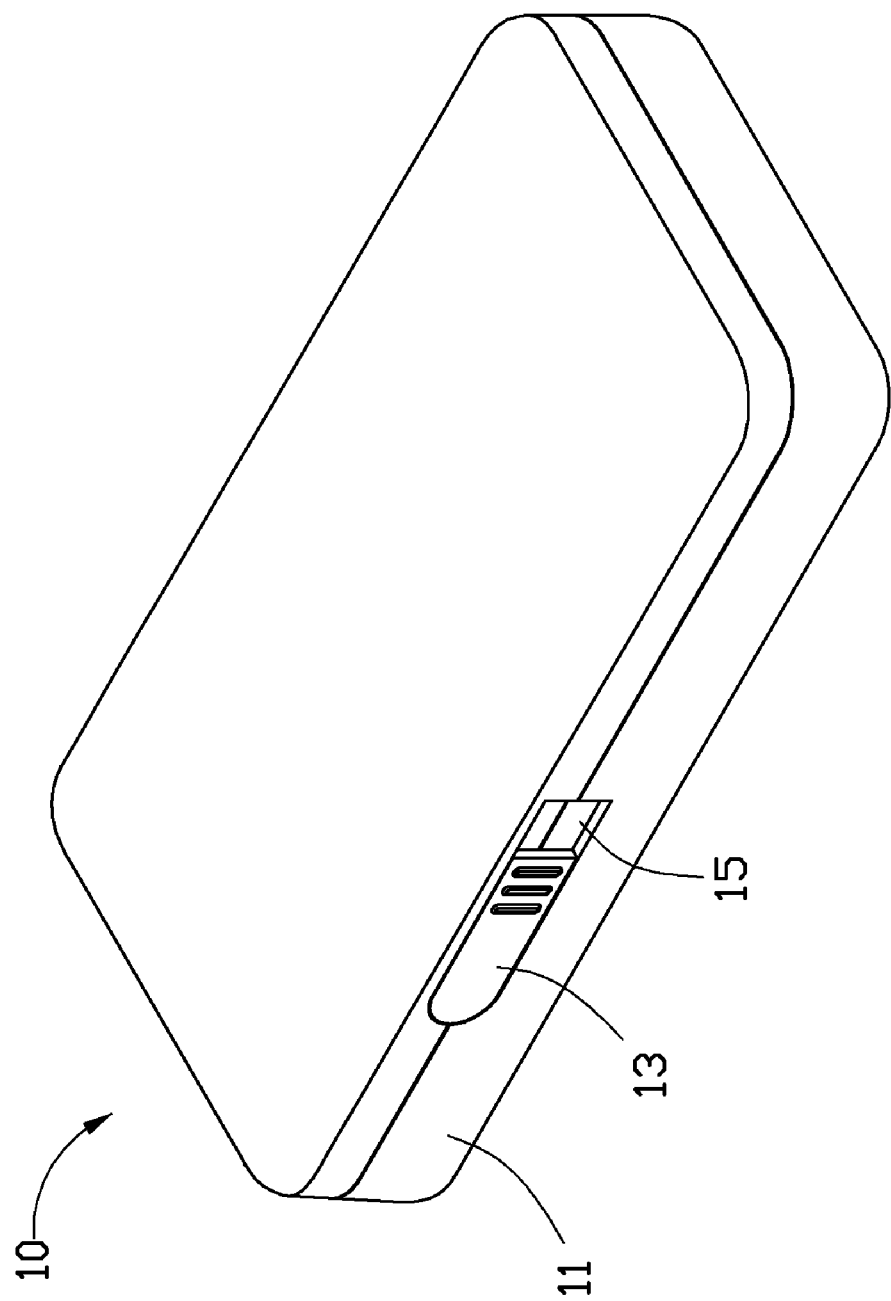
FIG. 2 is similar to FIG. 1, but showing a second work state.

Referring to FIGS. 1 and 2, a mobile phone 10 includes a housing 11, an earphone socket 12 assembled in the housing 11, and a protection cover 13 assembled on the housing 11 adjacent to the earphone socket 12. The protection cover 13 is capable of moving between a first position (shown as FIG. 1) and a second position (shown as FIG. 2) to expose or cover the earphone socket 12.

Figure 3:
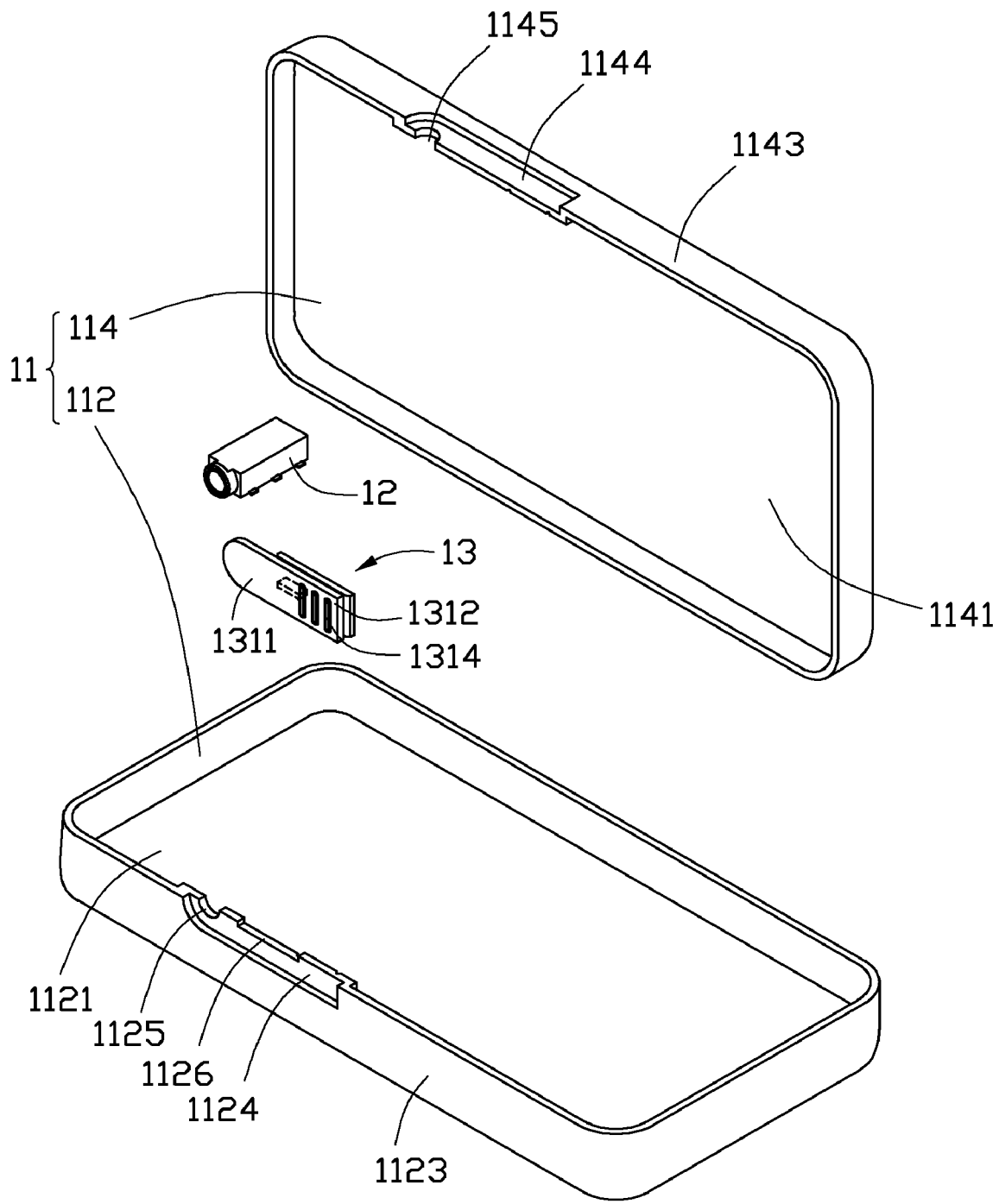
FIG. 3 is an exploded, isometric view of the electronic device in FIG. 1.
Figure 4:
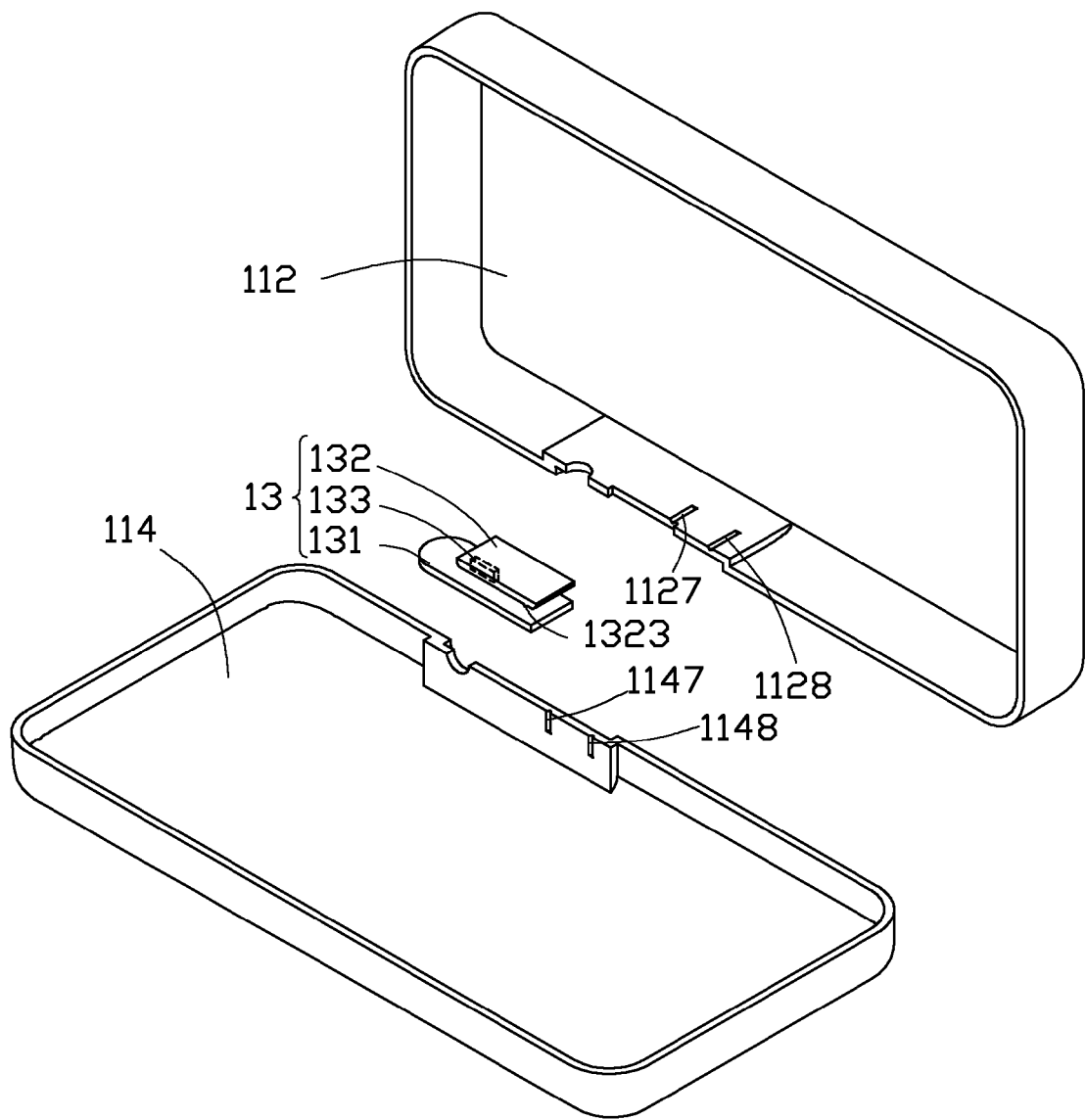
FIG. 4 is similar to FIG. 3, but viewed from another aspect.

Referring also to FIGS. 3 and 4, the housing 11 includes a first housing part 112 and a second housing part 114. In the illustrated embodiment, the first housing part 112 includes a first main plate 1121 and sidewalls 1123 extending from the first main plate 1121. The second housing part 114 includes a second main plate 1141 corresponding to the size and shape of first main plate 1121 and sidewalls 1143 extending from the second main plate 1141 and corresponding to sidewalls 1123.

The first housing part 112 defines a recessed portion 1124 in one of the sidewalls 1123, a notch 1125 in an end of the recessed portion 1124, and a sliding slot 1126 adjacent to the notch 1125. The second housing part 114 also defines a recessed portion 1144 corresponding to the recessed portion 1124, and a notch 1145 corresponding to the notch 1125. The recessed portions 1124, 1144 cooperatively define a receiving groove 15 to receive the protection cover 13. In the illustrated embodiment, the notches 1125, 1145 are both substantially semicircular and cooperatively define an earphone hole 16 corresponding to the earphone socket 12.

The first housing part 112 further defines two positioning grooves 1127, 1128 in an inner surface of the recessed portion 1124. The distance between the positioning grooves 1127, 1128 is equal to the distance between the first and second positions where the protection cover 13 is respectively located. The second housing part 114 also defines two positioning grooves 1147, 1148 in an inner surface of the recessed portion 1144 corresponding to the positioning grooves 1127, 1128 respectively. In the illustrated embodiment, the positioning grooves 1127, 1128, 1147, 1148 are substantially elongated V-shaped grooves.

The protection cover 13 includes a main body 131, a latching portion 132, and a sliding block 133 connecting the main body 131 and the latching portion 132. In the exemplary embodiment, the main body 131 is a plate having a covering end 1311 to cover the earphone socket 12 and an operating end 1312 opposite to the covering end 1311. The covering end 1311 may be rounded. The operating end 1312 forms a plurality of protruding ribs 1314 to facilitate a user to push the protection cover 13. The latching portion 132 is a plate, and forms a positioning protrusion 1323 on a surface facing the main body 131. The positioning protrusion 1323 is a substantially elongated V-shaped protrusion configured to engage in the positioning grooves 1127, 1147, or 1128, 1148. The distance between the main body 131 and the latching portion 132 is equal to or slightly smaller than the thickness of the recessed portions 1124, 1144, so that the recessed portions 1124, 1144 are clamped between the main body 131 and the latching portion 132.

The protection cover 13 may be integrally formed from rigid plastic materials, such as polyethylene, polyvinyl chloride, polypropylene, etc. The protection cover 13 may be elastic such that it is convenient to assemble the protection cover 13. The outer surface of the main body 131 may be painted or plated to have a color same as the housing 11, thus the mobile phone 10 may have a pleasing appearance. Alternatively, the protruding ribs 1314 may be substituted by a plurality of dots or a rough area. The positioning grooves 1127, 1128, 1147, 1148 and the positioning protrusion 1323 may have other varied shapes.

In assembly, the earphone socket 12 is assembled in one of first and second housing parts 112, 114 with the opening of the earphone socket 12 securely arranged between the notches 1125, 1126. The protection cover 13 is assembled on the recessed portion 1124, with the main body 131 and the latching portion 132 respectively positioned on opposite sides of recessed portion 1124, and the sliding block 133 is received in the sliding slot 1126. The first and second housing parts 112, 114 are then combined together, the recessed portions 1124, 1144 are clamped between the main body 131 and the latching portion 132. After assembly, the sliding block 133 is slidable in the sliding slot 1126, thus enabling the main body 131 to slide in the receiving groove 15.

Figure 5:
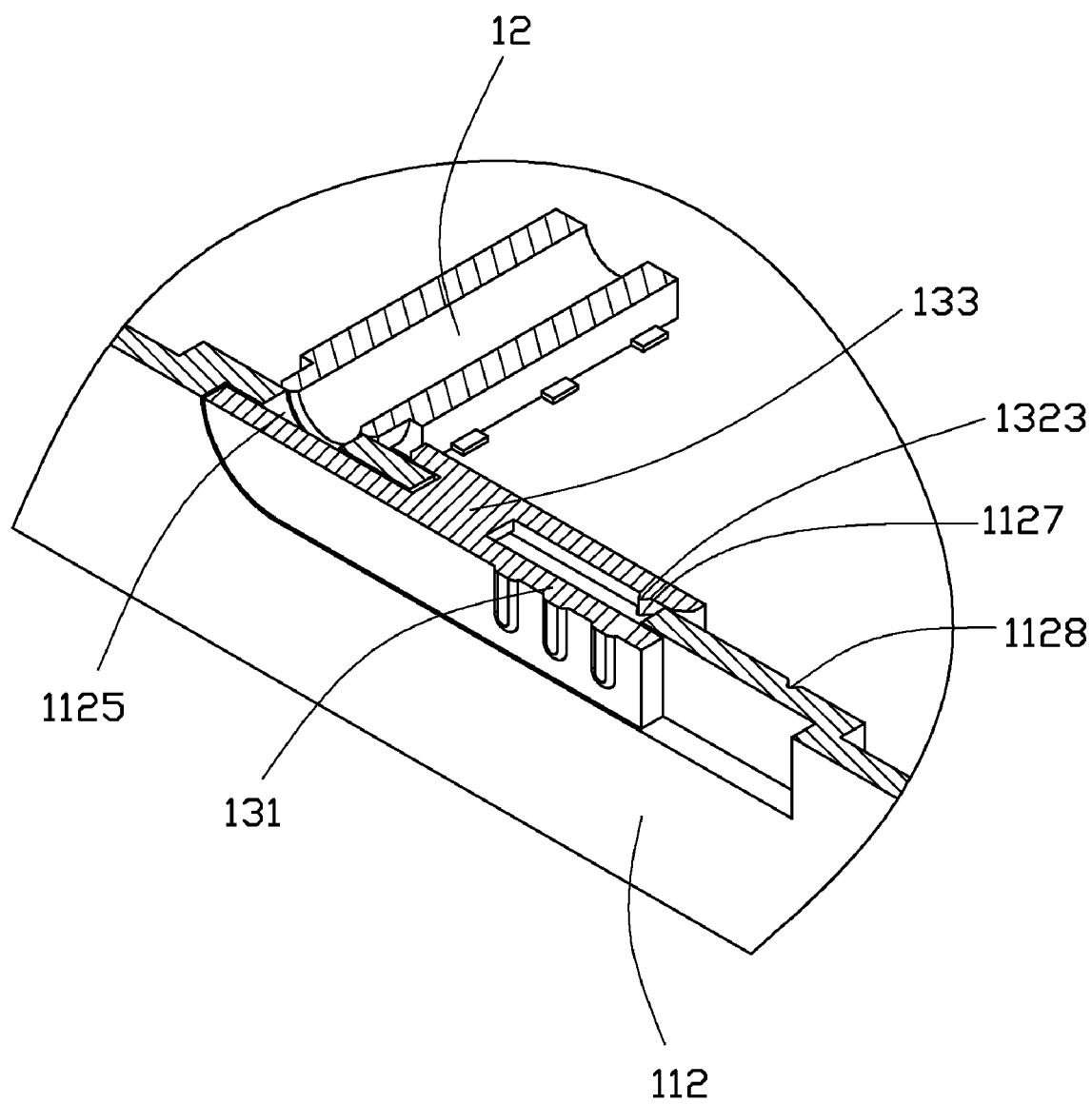
FIG. 5 is a partial, cross-sectional isometric view of the electronic device in FIG. 1.
Figure 6:
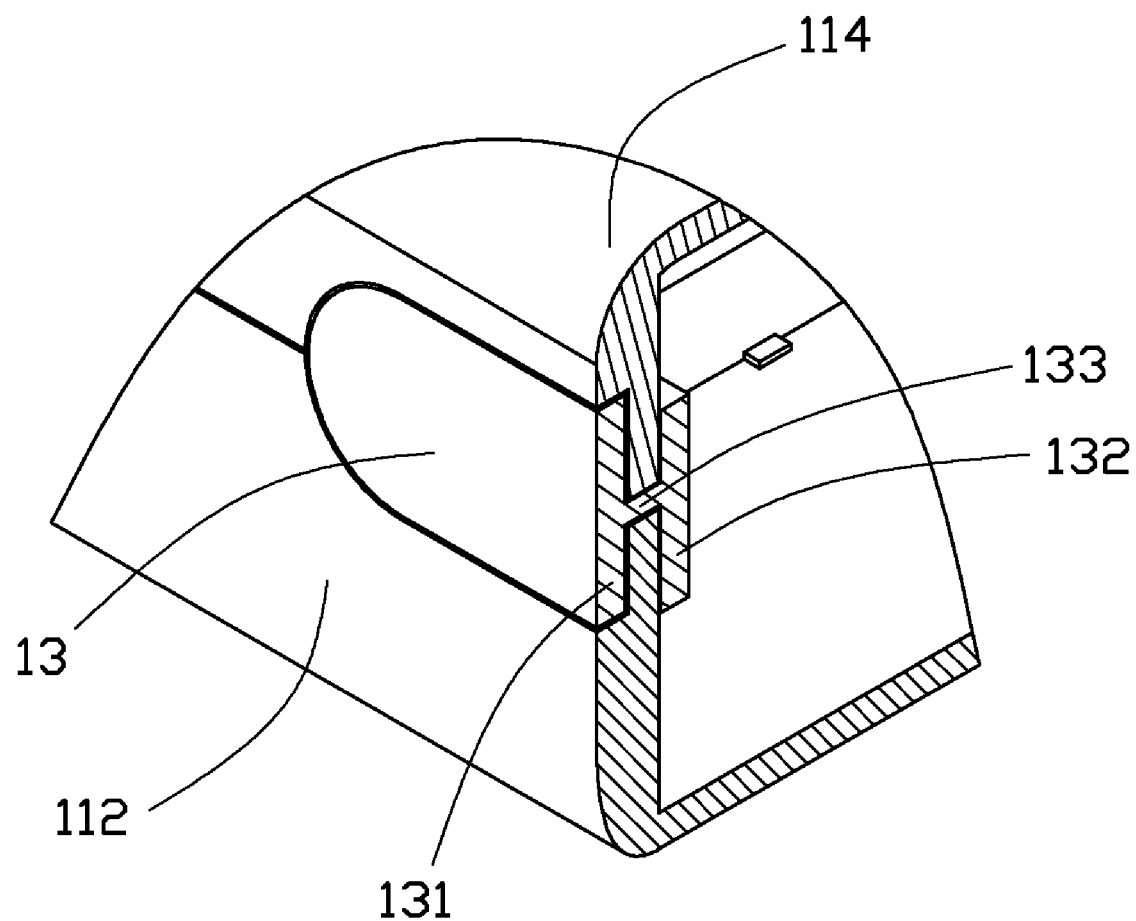
FIG. 6 is similar to FIG. 5, but taken along another section.

Referring also to FIGS. 5 and 6, when the earphone socket 12 does not need to be used, an external force is applied on the operating end 1312 to push the main body 131 to slide in the receiving groove 15 towards the earphone socket 12, until the earphone socket 12 is covered by the covering end 1311. At such time, the protection cover 13 is moved to the second position, the positioning protrusion 1323 is engaged in the positioning grooves 1127, 1147, thus retaining the protection cover 13 in the second position to protect the earphone socket 12 from being polluted by dust.

When the earphone socket 12 needs to be used, an external force is applied on the operating end 1312 to push the main body 131 to slide in the receiving groove 15 away from the earphone socket 12, until the earphone socket 12 is exposed. During the sliding process, the positioning protrusion 1323 is disengaged from the positioning grooves 1127, 1147 and abuts against the inner surfaces of the recessed portions 1124, 1144, thus enabling the protection cover 13 to slide stably relative to the housing 11. When the protection cover 13 is moved to the first position, the positioning protrusion 1323 is engaged in the positioning grooves 1128, 1148, thus retaining the protection cover 13 in the first position to facilitate using of the earphone socket 12.

In an alternative embodiment, the recessed portions 1124, 1144 may be omitted, the notches 1125, 1145, the sliding slot 1126 and the positioning grooves 1127, 1128, 1147, 1148 may be directly defined in the sidewalls 1123, 1143.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device comprising:
a housing defining a first housing part and a second housing part having a sidewall, the side wall defining a sliding slot and a socket hole therein;
a earphone socket assembled in the housing and at least partially exposed by the socket hole; and
a protection cover slidably assembled on the sidewall of the housing, wherein the protection cover comprises a main body, a latching portion spaced from the main body and a sliding block connecting the main body and the latching portion; the main body and the latching portion are respectively positioned on opposite sides of the sidewall, the sliding block is slidably engaged in the sliding slot, thus enabling the main body to slide between a first and a second positions to expose or cover the earphone socket;
wherein the sidewall of the housing defines two positioning grooves therein, the latching portion forms a positioning protrusion in a surface facing the main body to respectively engage in the two positioning grooves, thus retaining the protection cover in the first and the second positions.

2. The electronic device of claim 1, wherein the main body of the protection cover comprises a covering end to cover the earphone socket and an operating end opposite to the covering end.

3. The electronic device of claim 2, wherein the operating end forms a plurality of protruding ribs.

4. The electronic device of claim 1, wherein the distance between the main body and the latching portion is equal to or slightly smaller than the thickness of the sidewall of the housing.

5. The electronic device of claim 1, wherein the positioning grooves are substantially elongated V-shaped grooves, and the positioning protrusion is a substantially elongated V-shaped protrusion.

6. The electronic device of claim 1, wherein the sidewall of the housing defines a receiving groove, the main body is slidably received in the receiving groove.

7. The electronic device of claim 1, wherein the protection cover is integrally formed from rigid plastic materials.

8. The electronic device of claim 1, wherein the protection cover is elastic.

9. The electronic device of claim 1, wherein the outer surface of the main body is painted or plated to have a color same as the housing.

10. An electronic device comprising:
a housing defining a first housing part and a second housing part having a sidewall, the sidewall defining a socket hole, a sliding slot and two positioning grooves therein;
a earphone socket assembled in the housing and at least partially exposed by the socket hole; and
a protection cover slidably assembled on the sidewall of the housing, the protection cover comprising:
a main body;
a latching portion spaced from the main body and forming a positioning protrusion thereon, the main body and the latching portion respectively positioned on opposite sides of the sidewall; and
a sliding block connecting the main body and the latching portion, the sliding block slidably engaged in the sliding slot, thus enabling the main body to slide between a first and a second positions to expose or cover the earphone socket; the positioning protrusion respectively engaged in two positioning grooves, thus retaining the protection cover in the first and the second positions;
wherein the latching portion forms the positioning protrusion in a surface facing the main body to respectively engage in the two positioning grooves.

11. The electronic device of claim 10, wherein the main body of the protection cover comprises a covering end to cover the earphone socket and an operating end opposite to the covering end.

12. The electronic device of claim 11, wherein the operating end forms a plurality of protruding ribs.

13. The electronic device of claim 10, wherein the distance between the main body and the latching portion is equal to or slightly smaller than the thickness of the sidewall of the housing.

14. The electronic device of claim 10, wherein the positioning grooves are substantially elongated V-shaped grooves, and the positioning protrusion is a substantially elongated V-shaped protrusion.

15. The electronic device of claim 10, wherein the sidewall of the housing defines a receiving groove, the main body is slidably received in the receiving groove.

16. The electronic device of claim 10, wherein the protection cover is integrally formed from rigid plastic materials.

17. The electronic device of claim 10, wherein the protection cover is elastic.

18. The electronic device of claim 10, wherein the outer surface of the main body is painted or plated to have a color same as the housing.

* * * * *